(12) United States Patent
Kim et al.

(10) Patent No.: US 11,508,576 B2
(45) Date of Patent: Nov. 22, 2022

(54) METHOD FOR PRODUCING TRANSITION METAL DICHALCOGENIDEGRAPHENE HETERO JUNCTION COMPOSITE USING PLASMA

(71) Applicants: Research & Business Foundation Sungkyunkwan University, Suwon-si (KR); Ajou University Industry-Academic Cooperation Foundation, Suwon-si (KR)

(72) Inventors: Taesung Kim, Seoul (KR); Jaehyun Lee, Bucheon-si (KR); Hyunho Seok, Anyang-si (KR); Hyeong U Kim, Anyang-si (KR)

(73) Assignees: Research & Business Foundation Sungkyunkwan University, Suwon-si (KR); Ajou University Industry-Academic Cooperation Foundation, Suwon-si (KR)

( * ) Notice: Subject to any disclaimer, the term of this patent is extended or adjusted under 35 U.S.C. 154(b) by 0 days.

(21) Appl. No.: 17/329,394

(22) Filed: May 25, 2021

(65) Prior Publication Data
US 2021/0375619 A1 Dec. 2, 2021

(30) Foreign Application Priority Data

May 28, 2020 (KR) ........................ 10-2020-0063984

(51) Int. Cl.
*H01L 21/02* (2006.01)
*H01L 29/267* (2006.01)
*C01G 39/06* (2006.01)

(52) U.S. Cl.
CPC .... *H01L 21/02444* (2013.01); *H01L 21/0262* (2013.01); *H01L 21/02422* (2013.01);
(Continued)

(58) Field of Classification Search
CPC ......... H01L 21/02444; H01L 21/02422; H01L 21/02568; H01L 21/0262; H01L 21/02614;
(Continued)

(56) References Cited

U.S. PATENT DOCUMENTS 7,446,335 B2 * 11/2008 Kortshagen ............. C30B 7/005
257/51
2015/0083206 A1 * 3/2015 Novoselov .............. H01L 31/18
136/258

FOREIGN PATENT DOCUMENTS

| KR | 10-1529788 B1 | 6/2015 |
| KR | 10-2015-0139217 A | 12/2015 |
| KR | 10-1709704 B1 | 3/2017 |

OTHER PUBLICATIONS

Lu, Fei, et al. "Selective and confined growth of transition metal dichalcogenides on transferred graphene." *RSC advances* 7.59 (Jul. 27, 2017): pp. 37310-37314.
(Continued)

*Primary Examiner* — Dale E Page
*Assistant Examiner* — Quovaunda Jefferson
(74) *Attorney, Agent, or Firm* — NSIP Law (57) ABSTRACT

A method for producing a transition metal dichalcogenide-graphene heterojunction composite, the method includes: transferring a graphene onto a flexile substrate; depositing a transition metal layer on the flexible substrate onto which the graphene has been transferred; and injecting a gas containing plasma-treated sulfur (S) onto the flexile substrate onto which the transition metal layer has been deposited, is disclosed.

16 Claims, 12 Drawing Sheets
(1 of 12 Drawing Sheet(s) Filed in Color)

(52) U.S. Cl.
CPC ...... *H01L 21/02568* (2013.01); *H01L 29/267* (2013.01); *C01G 39/06* (2013.01)

(58) Field of Classification Search
CPC ... H01L 29/267; C30B 25/105; C30B 25/165; C30B 25/18; C01B 32/186; C01B 32/194; C01G 39/06; C01P 2004/64; C01P 29/46
See application file for complete search history.

(56) References Cited

OTHER PUBLICATIONS

Korean Office Action dated Jan. 25, 2022 in corresponding Korean Patent Application No. 10-2020-0063984 (6 pages in Korean).

\* cited by examiner

METHOD FOR PRODUCING TRANSITION METAL DICHALCOGENIDEGRAPHENE HETERO JUNCTION COMPOSITE USING PLASMA

CROSS-REFERENCE TO RELATED APPLICATIONS

This application claims the priority of Korean Patent Application No. 10-2020-0063984 filed on May 28, 2020, in the Korean Intellectual Property Office, the disclosure of which is incorporated herein by reference.

BACKGROUND

Field

The present application relates to a method for producing a transition metal dichalcogenide-graphene heterojunction composite.

Description of the Related Art

In line with the trend of lightening and miniaturization of devices in the mobile communication field, which is experiencing remarkable growth in recent years, substrates of display elements such as liquid crystal displays (LCDs) and organic electroluminescence (EL) displays are being replaced by flexible polymer materials from glass.

Accordingly, although a thin film transistor (TFT) has been mainly used as a switching element of an active-driving liquid crystal display element in a conventional display field, attempts have recently been made to produce a thin film diode (TFD) element which consumes about $\frac{1}{7}$ less power and also has a low production cost compared to a TFT element on a flexible polymer substrate.

Since most of flexible substrates have a melting point of around 200° C. such that direct deposition is not possible in high-temperature processes, there existed only a method for wet-transferring a material onto a flexible substrate by using a material synthesized by a chemical vapor deposition method as a polymer film as a method for producing a conventional flexible element. However, this has a problem in that polymer foreign substances remain after wet transfer, and greatly deteriorate electrical performance or catalytic performance.

Meanwhile, a heterojunction element may be used as various electronic elements such as diodes, memories, and transistors by bonding different types of semiconductors or by using a semiconductor-metal junction or a metal-insulator-semiconductor junction.

In general, graphene showing metallic properties has a problem in that it is difficult to use as a high-performance semiconductor material suitable for real life since it is made into a special structure or shows semiconductor properties only in a specific environment. Therefore, research on combination of graphene and two-dimensional materials having properties of semiconductors such as molybdenum disulfide ($MoS_2$) has been actively conducted.

A conventional dry transfer method for producing a heterojunction composite has problems in that it requires several steps of transfer, and it is very difficult to adjust the direction and position rendering poor reproducibility, and the produced size is also very small in microns.

Accordingly, it is required to develop a method for producing a heterojunction composite which can be directly synthesized on a flexible substrate at low temperatures, and not only dispense with a transfer process after synthesis, but also has a high reproducibility and a very large area.

Korean Registered Patent Publication No. 10-1709704, which is the background art of the present application, relates to a method for transferring a material using petroleum jelly, and specifically relates to a method for transferring a material including one or more selected from the group consisting of graphene, graphene oxide, h-BN, $MoS_2$, $WS_2$, $MoS_2$, $WS_2$, $MoSe_2$, $WSe_2$, and carbon nanotubes onto a second substrate which is any one selected from the group consisting of a flexible substrate, a conductor, a dielectric, or a semiconducting material without damage to the second substrate using petroleum jelly as a transfer support, and removing a petroleum jelly transfer support after transfer. However, it does not mention a transition metal dichalcogenide-graphene heterojunction composite having a continuous interface without a polymer residue, produced using plasma.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for producing a transition metal dichalcogenide-graphene heterojunction composite includes transferring a graphene onto a flexible substrate, depositing a transition metal layer on the flexible substrate onto which the graphene has been transferred, and injecting a gas containing plasma-treated sulfur (S) onto the flexible substrate on which the transition metal layer has been deposited.

The transition metal layer may include a transition metal selected from the group consisting of Mo, W, Cu, Ni, Sc, Ti, V, Cr, Mn, Fe, Co, Zn, Y, Zr, Nb, Tc, Ru, Rh, Pd, Ag, Cd, Hf, Ta, Re, Os, Ir, Pt, Au, Hg, Rf, db, Sg, Bh, Hs, Mt, Ds, Rg, Cn, and combinations thereof.

The flexible substrate may include a material selected from the group consisting of a silicone, a polymer, and a combination thereof.

The graphene may be synthesized by a chemical vapor deposition method.

The depositing the transition metal layer may be performed by a deposition method selected from the group consisting of electron-beam evaporation, RF/DC sputtering, ion beam sputtering, chemical vapor deposition (CVD), low pressure chemical vapor deposition (LPCVD), plasma enhanced chemical vapor deposition (PECVD), ion plating, and combinations thereof.

The gas containing plasma-treated sulfur (S) may include hydrogen sulfide ($H_2S$).

The injecting the gas containing plasma-treated sulfur (S) may be performed under a temperature of 100° C. to 200° C.

The gas containing plasma-treated sulfur (S) may be injected together with a carrier gas.

The gas containing plasma-treated sulfur (S) may be supplied in a flow amount of 1 sccm to 20 sccm.

The transition metal dichalcogenide-graphene heterojunction composite may include nanocrystals having a diameter of 5 nm to 10 nm.

The nanocrystals may have an average size adjusted to a nano scale by the plasma treatment.

The transition metal dichalcogenide-graphene heterojunction composite may include sulfur pores.

The sulfur pores may be formed by a lattice structure difference between the transition metal dichalcogenide and the graphene.

In another general aspect, a transition metal dichalcogenide-graphene heterojunction composite produced by the method is disclosed.

The transition metal dichalcogenide-graphene heterojunction composite may include nanocrystals having a diameter of 5 nm to 10 nm.

The transition metal dichalcogenide-graphene heterojunction composite may include sulfur pores.

In still another general aspect, a flexible element including the transition metal dichalcogenide-graphene heterojunction composite is disclosed.

Other features and aspects will be apparent from the following detailed description and the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

In the present disclosure, when a part is referred as to be "connected" to the other part, the parts are not only "directly connected" to each other, but also "electrically connected" to each other while interposing another part therebetween.

In the present disclosure, when any member is positioned "on", "over", "above", "beneath", "under", and "below" the other member, this not only includes a case that the any member is brought into contact with the other member, but also includes a case that another member exists between two members.

In the present disclosure, if a prescribed part "includes" a prescribed element, this means that another element can be further included instead of excluding other elements unless any particularly opposite description exists.

When unique manufacture and material allowable errors of numerical values are suggested to mentioned meanings of terms of degrees used in the present specification such as "about", and "substantially", the terms of degrees are used in the numerical values or as a meaning near the numerical values, and the terms of degrees are used to prevent that an unscrupulous infringer unfairly uses a disclosure content in which exact or absolute numerical values are mentioned to help understanding of the present application. Further, in the whole specification of the present application, "a step to do ~" or "a step of ~" does not mean "a step for ~".

In the present disclosure, a term of "a combination thereof" included in a Markush type expression, which means a mixture or combination of one or more selected from the group consisting of elements described in the Markush type expression, means including one or more selected from the group consisting of the elements.

In the present disclosure, description of "A and/or B" means "A, B, or A and B".

The present disclosure is to solve the problems of the related art described above, and an object of the present disclosure is to provide a transition metal dichalcogenide-graphene heterojunction composite and a method for producing the same.

Furthermore, an object of the present disclosure is to provide a flexible element including the transition metal dichalcogenide-graphene heterojunction composite.

However, technical problems to be achieved by embodiments of the present disclosure are not limited to the technical problems as described above, and other technical problems may exist.

According to the above-described problem-solving means of the present disclosure, since most of flexible substrates have a melting point of around 200° C. such that direct deposition is not possible in the high-temperature processes, there existed only a method for wet-transferring a material onto the flexible substrates by using a material synthesized by a chemical vapor deposition method as a polymer film as a method for producing a conventional flexible element. This has a problem in that polymer foreign substances remain after wet transfer, and greatly deteriorate electrical performance or catalytic performance. However, since a method for producing a transition metal dichalcogenide-graphene heterojunction composite according to the present disclosure can provide a transition metal dichalcogenide-graphene heterojunction composite directly deposited on a flexible substrate, which does not have polymer residues generated during transfer and has a continuous interface by directly depositing a transition metal dichalcogenide-graphene heterojunction composite on the flexible substrate at low temperatures using plasma, the transition metal dichalcogenide-graphene heterojunction composite directly deposited on the flexible substrate can be used in various fields such as a flexible element and a flexible sensor.

In addition, whereas a dry transfer method for producing a conventional heterojunction composite has had problems of requiring several steps of transfer, is very difficult to adjust direction and position rendering poor reproducibility, and the produced size is also very small in microns, a method for producing the transition metal dichalcogenide-graphene heterojunction composite according to the present disclosure can produce a transition metal dichalcogenide-graphene heterojunction composite, which not only dispense with a transfer process after synthesis, but also has a high reproducibility and a very large area by directly synthesizing a transition metal dichalcogenide-graphene heterojunction composite on a flexible substrate at low temperatures using plasma. Therefore, the method for producing a transition metal dichalcogenide-graphene heterojunction composite according to the present disclosure may have excellent economic efficiency by enabling the production process to be simplified.

Further, the transition metal dichalcogenide-graphene heterojunction composite according to the present disclosure is uniformly heterojunctioned in all boundaries, different from a simple stacked structure manufactured by a physical transfer method, such that there is no performance deterioration and a high yield can be obtained when producing an element.

Further, different from a conventional chemical transfer method, the transition metal dichalcogenide-graphene heterojunction composite according to the present disclosure may not be contaminated by chemical substances.

Further, the transition metal dichalcogenide-graphene heterojunction composite according to the present disclosure can obtain a plurality of grain boundaries by reducing the crystal size to a nano size using plasma, and may generate a number of sulfur pores due to a lattice structure difference between transition metal dichalcogenide and graphene. Therefore, the sensitivity as a sensor may be improved due to the active reaction present in the grain boundaries and sulfur pores.

However, the effect obtainable in the present disclosure is not limited to the above-described effects, and other effects may exist.

Hereinafter, the method for producing a transition metal dichalcogenide-graphene heterojunction composite according to the present disclosure will be described in detail with reference to embodiments, examples, and drawings. However, the present disclosure is not limited to such embodiments, examples, and drawings.

Figure 1:
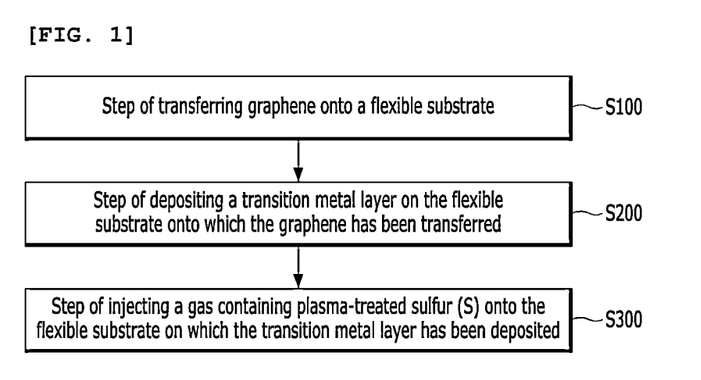
FIG. 1 is a flow chart showing the method for producing a transition metal dichalcogenide-graphene heterojunction composite according to an embodiment of the present disclosure.
Figure 2:
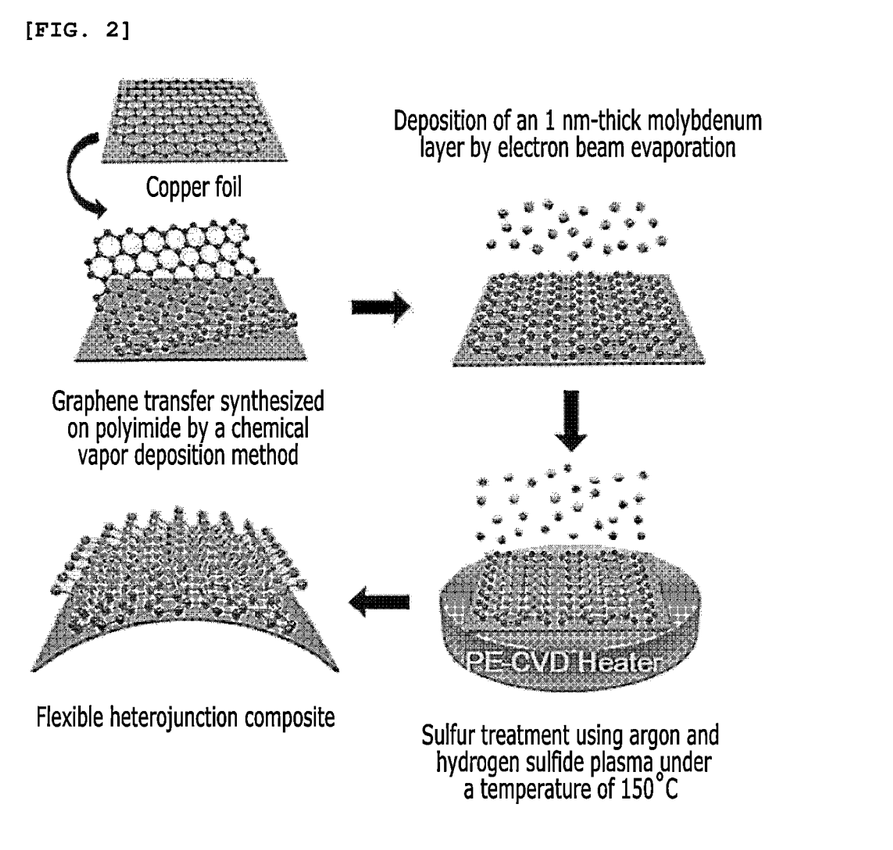
FIG. 2 is a schematic diagram of production steps of the transition metal dichalcogenide-graphene heterojunction composite according to an embodiment of the present disclosure.

FIG. 1 is a flow chart showing the method for producing the transition metal dichalcogenide-graphene heterojunction composite according to an embodiment of the present disclosure, and FIG. 2 is a schematic diagram of production steps of the transition metal dichalcogenide-graphene heterojunction composite according to an embodiment of the present disclosure.

As a technical means for achieving the technical problem described above, the first aspect of the present application provides a method for producing a transition metal dichalcogenide-graphene heterojunction composite, the method including transferring a graphene onto a flexible substrate, depositing a transition metal layer on the flexible substrate onto which the graphene has been transferred, and injecting a gas containing plasma-treated sulfur (S) onto the flexible substrate on which the transition metal layer has been deposited.

A dry transfer method for producing a conventional heterojunction composite has disadvantages that it requires several steps of transfer, and it is very difficult to adjust the direction and position such that reproducibility is poor, and the produced size is also very small in microns.

The method for producing a transition metal dichalcogenide-graphene heterojunction composite provided in the present disclosure can produce the transition metal dichalcogenide-graphene heterojunction composite which not only does not require a transfer process after synthesis, but also has a high reproducibility and a very large area by directly synthesizing a transition metal dichalcogenide-graphene heterojunction composite on a flexible substrate at low temperatures using plasma. Therefore, the method for producing a transition metal dichalcogenide-graphene heterojunction composite provided in the present disclosure may have an advantage of excellent economic efficiency by enabling the production process to be simplified.

Further, the transition metal dichalcogenide-graphene heterojunction composite according to the present disclosure is uniformly heterojunctioned in all boundaries, different from a simple stacked structure manufactured by a physical transfer method, such that there is no performance deterioration and a high yield can be obtained when producing an element.

According to an embodiment of the present disclosure, although the transition metal layer may include a transition metal selected from the group consisting of Mo, W, Cu, Ni, Sc, Ti, V, Cr, Mn, Fe, Co, Zn, Y, Zr, Nb, Tc, Ru, Rh, Pd, Ag, Cd, Hf, Ta, Re, Os, Ir, Pt, Au, Hg, Rf, db, Sg, Bh, Hs, Mt, Ds, Rg, Cn, and combinations thereof, it is not limited thereto.

For example, although the transition metal layer may include molybdenum (Mo), it is not limited thereto.

Molybdenum disulfide among two-dimensional materials has a band gap and electrical properties which are varied depending on the atomic structure and the number of layers. In addition, molybdenum is attracting attention as a material capable of replacing silicon since it has the most similar band gap to silicon. Also, graphene has high electron mobility. Accordingly, the heterojunction composite of molybdenum disulfide and graphene according to an embodiment of the present application has an advantage of enabling the efficiency of the sensor to be increased by allowing a high-conductivity graphene layer to rapidly move a current generated on the molybdenum disulfide surface.

In order to produce the transition metal dichalcogenide-graphene heterojunction composite, the step of transferring graphene onto a flexible substrate is first performed (S100).

According to an embodiment of the present disclosure, although the flexible substrate may include a material selected from the group consisting of a silicone, a polymer, and a combination thereof, it is not limited thereto.

According to an embodiment of the present disclosure, although the graphene may be synthesized by a chemical vapor deposition method, it is not limited thereto. When graphene is synthesized by the chemical vapor deposition method, there is an advantage of enabling large-area graphene to be manufactured.

Subsequently, the step of depositing a transition metal layer on the flexible substrate onto which the graphene has been transferred is performed (S200).

According to an embodiment of the present disclosure, although the step of depositing the transition metal layer may be performed by a deposition method selected from the group consisting of electron-beam evaporation, RF/DC sputtering, ion beam sputtering, chemical vapor deposition (CVD), low pressure chemical vapor deposition (LPCVD), plasma enhanced chemical vapor deposition (PECVD), ion plating, and combinations thereof, it is not limited thereto.

For example, although the step of depositing the transition metal layer may be performed by electron-beam evaporation, it is not limited thereto.

Subsequently, the step of injecting a gas containing plasma-treated sulfur (S) onto the flexible substrate on which the transition metal layer has been deposited is performed (S300).

According to an embodiment of the present disclosure, although the gas containing plasma-treated sulfur (S) may include hydrogen sulfide ($H_2S$), it is not limited thereto.

In the case of hydrogen sulfide ($H_2S$), hydrogen gas is generated as a by-product, and since it can be removed by replacing with water ($H_2O$) and oxygen ($O_2$) through a scrubber, it has an advantage of the excellent safety of the manufacturing process.

According to an embodiment of the present disclosure, although the step of injecting the gas containing plasma-treated sulfur (S) may be performed under a temperature of about 100° C. to about 200° C., it is not limited thereto.

For example, although the step of injecting the gas containing plasma-treated sulfur (S) may be performed under a temperature of about 150° C., it is not limited thereto.

A Chemical Vapor Deposition (CVD) method, as a method in which a gaseous compound is reacted on a heated substrate surface to deposit a product on the substrate surface, is most widely used among thin film manufacturing technologies currently used commercially, because of its advantages such as less damage to the substrate surface since the contribution of high-speed particles during deposition is small. The plasma enhanced chemical vapor deposition (PECVD) method among the deposition methods may greatly lower the process temperature compared to thermal CVD by making the reaction gas into a plasma state through high-speed electrons, thereby accelerating the reaction.

Meanwhile, since most of the flexible substrates have a melting point of around 200° C. such that direct deposition is not possible in the high-temperature processes, there existed only a method for wet-transferring the material onto the flexible substrate by using a material synthesized by the chemical vapor deposition method as the polymer film as a method for producing the conventional flexible element. However, this has a disadvantage in that polymer foreign substances remain after wet transfer, and greatly deteriorate electrical performance or catalytic performance.

The method for producing a transition metal dichalcogenide-graphene heterojunction composite provided in the present disclosure enables a transition metal dichalcogenide-graphene heterojunction composite to be directly deposited on a flexible substrate by significantly lowering the process temperature to a relatively low temperature of about 100° C. to about 200° C. using a plasma enhanced chemical vapor deposition (PECVD) method. Accordingly, it is possible to produce a transition metal dichalcogenide-graphene heterojunction composite directly deposited on a flexible substrate, which does not have polymer residues generated during transfer and has a continuous interface.

According to an embodiment of the present disclosure, although the gas containing plasma-treated sulfur (S) may be injected together with a carrier gas, it is not limited thereto.

For example, although the carrier gas may be argon (Ar), it is not limited thereto.

Argon (Ar), an inert gas, is an inert gas, which is more easily ionized than hydrogen sulfide ($H_2S$) gas, and undergoes random motion in the plasma. At this time, a non-ionized hydrogen sulfide ($H_2S$) collides with argon (Ar) such that the non-ionized hydrogen sulfide ($H_2S$) loses electrons, and is ionized into hydrogen sulfide ions ($H_2S^+$). Therefore, if argon (Ar) is injected at a certain ratio, more hydrogen sulfide ions ($H_2S^+$) may be obtained. Accordingly, hydrogen sulfide ions ($H_2S^+$) and molybdenum (Mo) atoms may be bonded to each other.

According to an embodiment of the present disclosure, although the gas containing sulfur (S) may be supplied in a flow amount of about 1 sccm to about 20 sccm, it is not limited thereto.

According to an embodiment of the present disclosure, although the transition metal dichalcogenide-graphene heterojunction composite may include nanocrystals having a diameter of about 5 nm to about 10 nm, it is not limited thereto.

According to an embodiment of the present disclosure, although the nanocrystals may have a size adjusted to a nano size by the plasma treatment, they are not limited thereto.

More specifically, hydrogen sulfide ($H_2S^+$) and argon (Ar) ionized in the plasma sheath are accelerated toward and collided with an electrically neutral substrate, and synthesize a molybdenum (Mo) metal layer with molybdenum disulfide, while causing a bombardment reaction. Subsequently, as the crystallization and bombardment reactions are repeated, the crystal size is reduced to a uniform nano size. Accordingly, there is an advantage in that a transition metal dichalcogenide-graphene heterojunction composite having a plurality of grain boundaries may be provided.

According to an embodiment of the present disclosure, although the transition metal dichalcogenide-graphene heterojunction composite may include sulfur pores, it is not limited thereto.

According to an embodiment of the present disclosure, although the sulfur pores may be formed by a lattice structure difference between transition metal dichalcogenide and graphene, they are not limited thereto.

The method for producing an octahedral transition metal dichalcogenide provided in the present disclosure may obtain a plurality of grain boundaries by reducing the crystal size to a nano size using plasma, and may generate a number of sulfur pores due to a lattice structure difference between transition metal dichalcogenide and graphene. Therefore, the sensitivity may be improved when used as a sensor due to the active reaction occurring in the grain boundaries and the sulfur pores. Further, the performance may be excellent when used as a hydrogen generation catalyst due to a hydrogen generation reaction which mainly occurs in the sulfur pores.

A second aspect of the present application provides the transition metal dichalcogenide-graphene heterojunction composite produced by the method according to the first aspect of the present disclosure.

With respect to the transition metal dichalcogenide-graphene heterojunction composite of the second aspect of the present disclosure, although detailed descriptions of parts overlapping with the first aspect of the present disclosure have been omitted, the content described in the first aspect of the present disclosure may be equally applied to the second aspect of the present disclosure, even if the descriptions have been omitted.

According to an embodiment of the present disclosure, although the transition metal dichalcogenide-graphene heterojunction composite may include nanocrystals having a diameter of about 5 nm to about 10 nm, it is not limited thereto.

According to an embodiment of the present disclosure, although the transition metal dichalcogenide-graphene heterojunction composite may include sulfur pores, it is not limited thereto.

A third aspect of the present disclosure provides a flexible element including the transition metal dichalcogenide-graphene heterojunction composite according to the second aspect of the present disclosure.

With regard to the flexible element including the transition metal dichalcogenide-graphene heterojunction composite of the third aspect of the present disclosure, although detailed descriptions of parts overlapping with the second aspect of the present disclosure have been omitted, the content described in the second aspect of present disclosure may be equally applied to the third aspect of the present disclosure, even if the descriptions have been omitted.

The transition metal dichalcogenide-graphene heterojunction composite according to the present application has a nano-sized crystal size such that sensitivity may be improved due to the property of increasing the boundaries. Therefore, it may be effectively used as a flexible element.

Although the present disclosure will be described in more detail through the following examples, the following examples are for illustrative purposes only and are not intended to limit the scope of the present application.

[Example] Production of the Transition Metal Dichalcogenide-Graphene Heterojunction Composite ($MoS_2$-Graphene)

A graphene thin film manufactured by using a chemical vapor deposition method was transferred onto a polymer substrate.

Subsequently, molybdenum (Mo) was deposited to a thickness of 1 nm on the graphene-transferred substrate using an electron beam evaporator.

Subsequently, the molybdenum-graphene coated substrate was loaded into a plasma enhanced chemical vapor deposition (PECVD) chamber, and the tungsten-coated substrate was heated to 150° C. in an argon (Ar) atmosphere. After the temperature reached a reaction temperature (150° C.), the transition metal dichalcogenide-graphene heterojunction composite ($MoS_2$-Graphene) was produced by treating hydrogen sulfide ($H_2S$) and argon (Ar) plasma on the tungsten-coated substrate at a rate of 10:10 sccm for 90 minutes.

Comparative Example

A graphene thin film manufactured by using a chemical vapor deposition method was transferred onto a polymer substrate.

Subsequently, the molybdenum disulfide was synthesized on a $SiO_2$/Si wafer using the chemical vapor deposition method.

Subsequently, after spin-coating the synthesized molybdenum disulfide with a polymethyl methacrylate (PMMA) solution, an $SiO_2$ layer was etched with hydrofluoric acid. After performing the etching process, the etched $SiO_2$ layer was immersed in distilled water to obtain PMMA-coated $MOS_2$ floating on an Si wafer.

Subsequently, after transferring the PMMA-coated $MOS_2$ onto the polymer substrate onto which the graphene thin film had been transferred, PMMA was removed with acetone to obtain the transition metal dichalcogenide-graphene ($MoS_2$-Graphene) heterojunction composite produced by the physical transfer method.

Figure 3A:
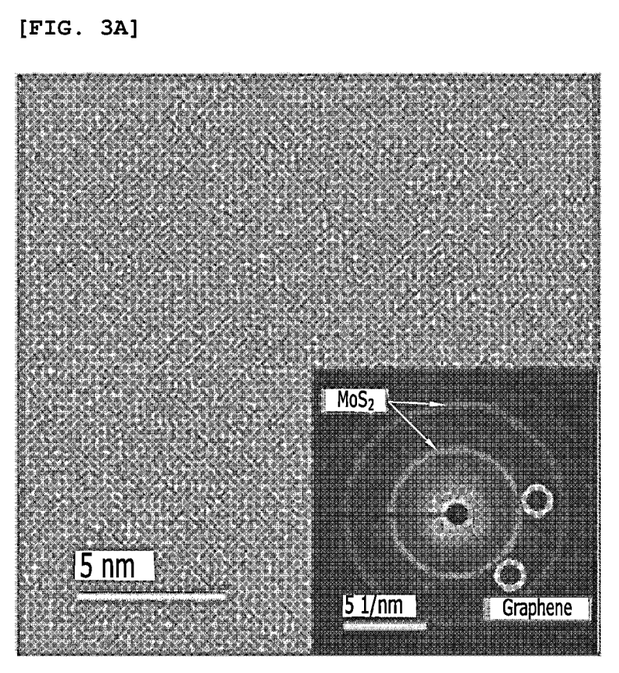
FIGS. 3A to 3C are TEM images of the transition metal dichalcogenide-graphene heterojunction composites according to an example and a comparative example of the present disclosure.
Figure 3B:
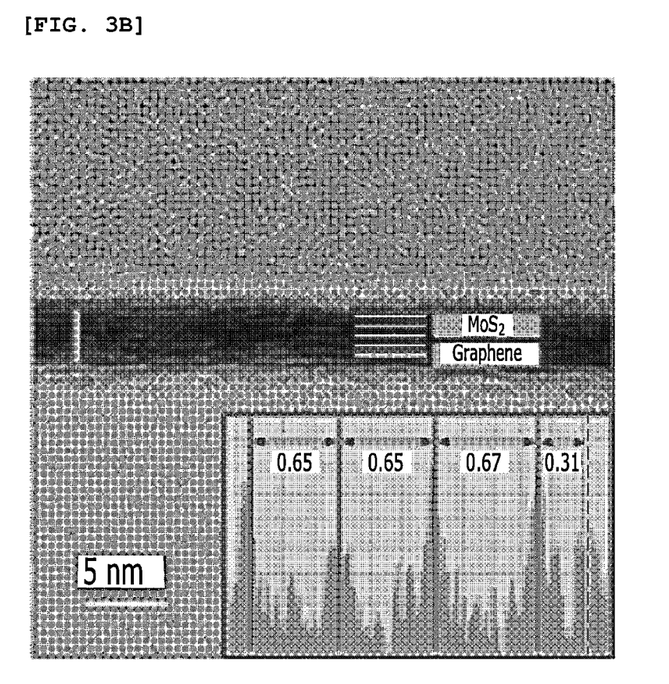
Figure 3C:
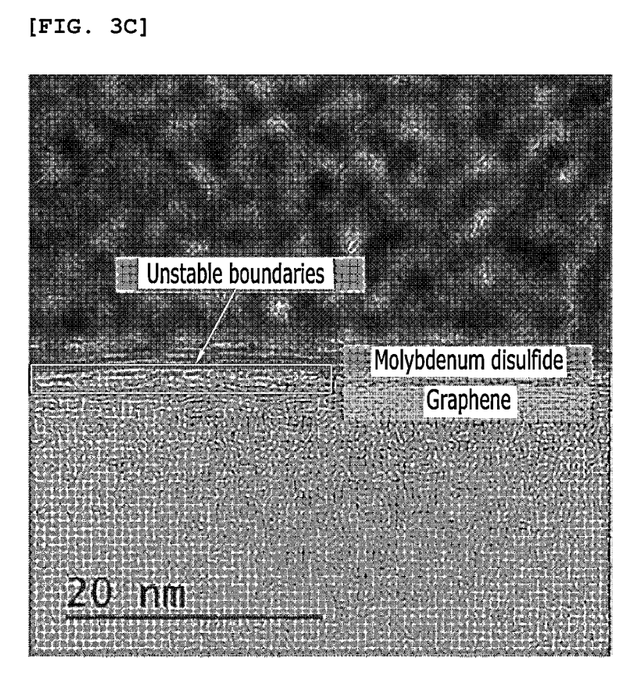
Figure 4A:
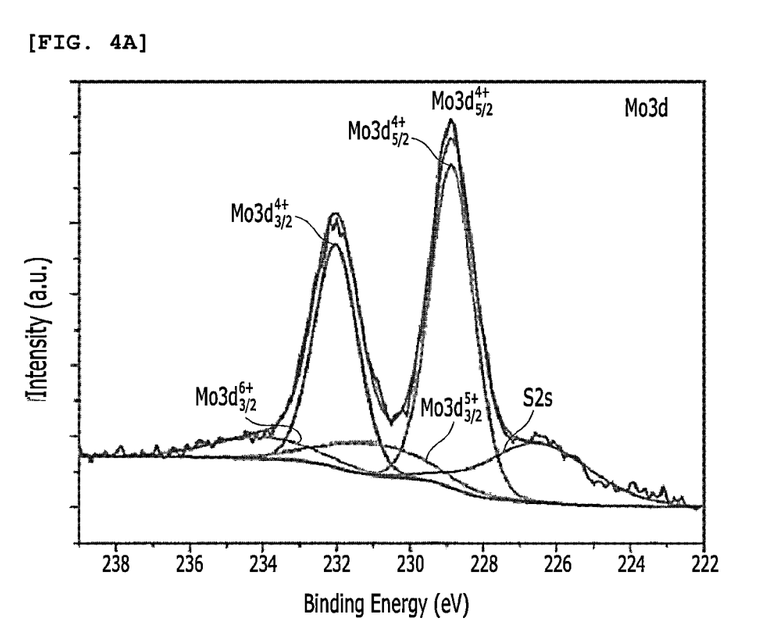
FIGS. 4A to 4E are graphs of the transition metal dichalcogenide-graphene heterojunction composite according to an example of the present disclosure analyzed using X-ray photoelectron spectroscopy (XPS)
Figure 4B:
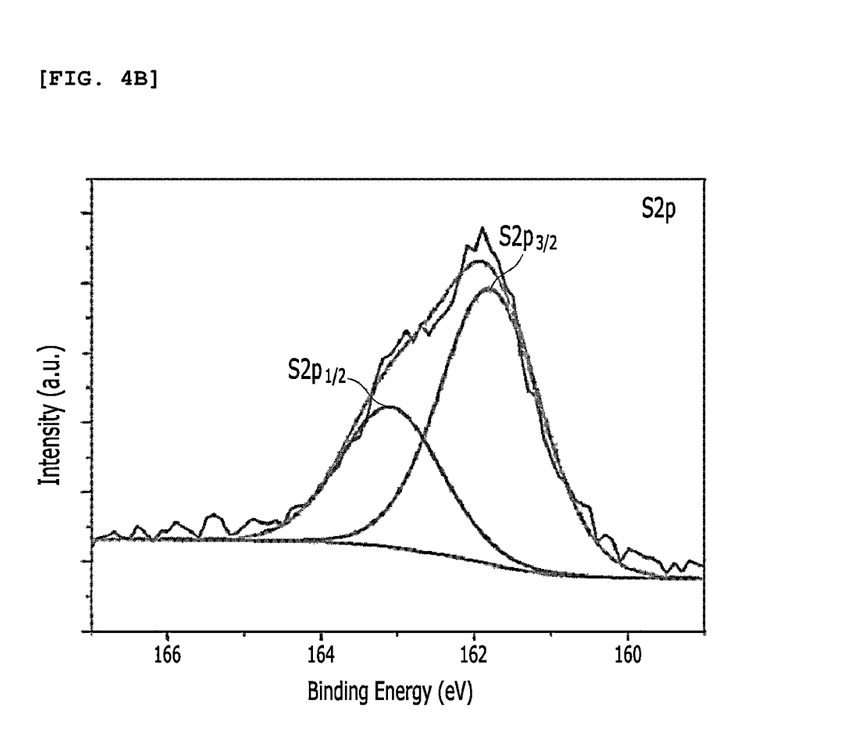
Figure 4C:
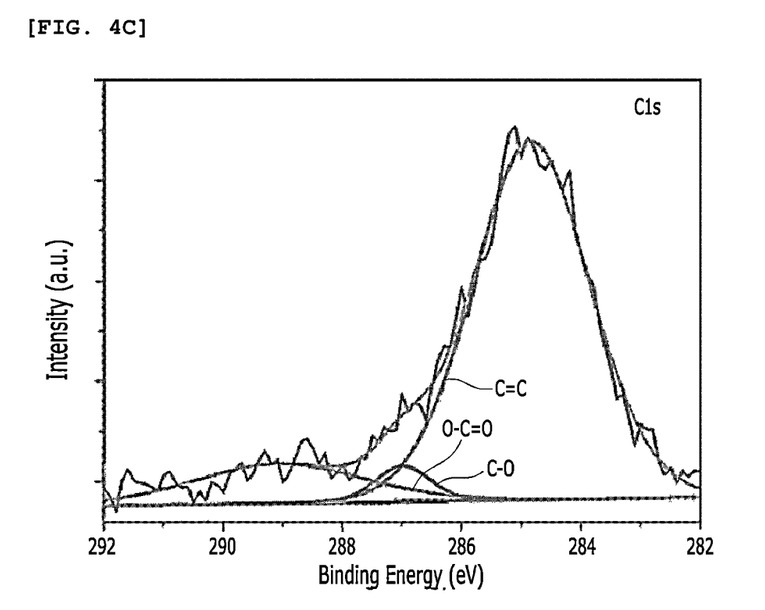
Figure 4D:
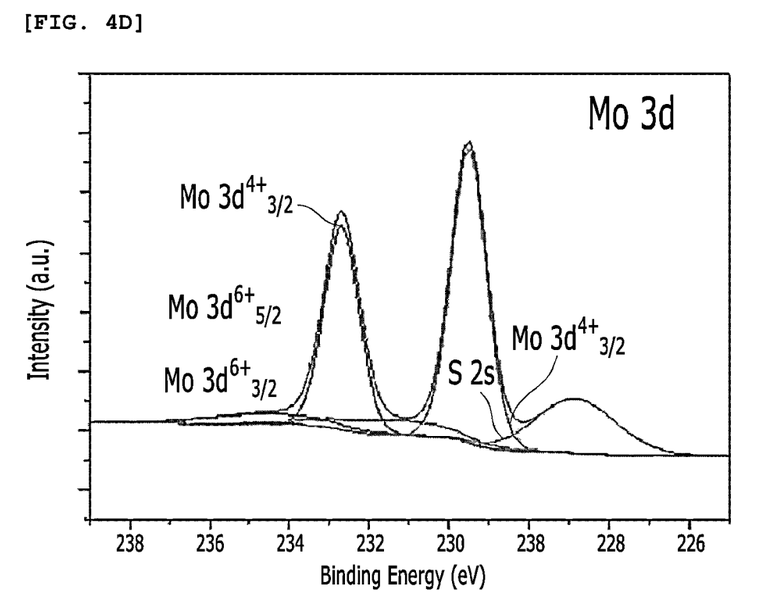
Figure 4E:
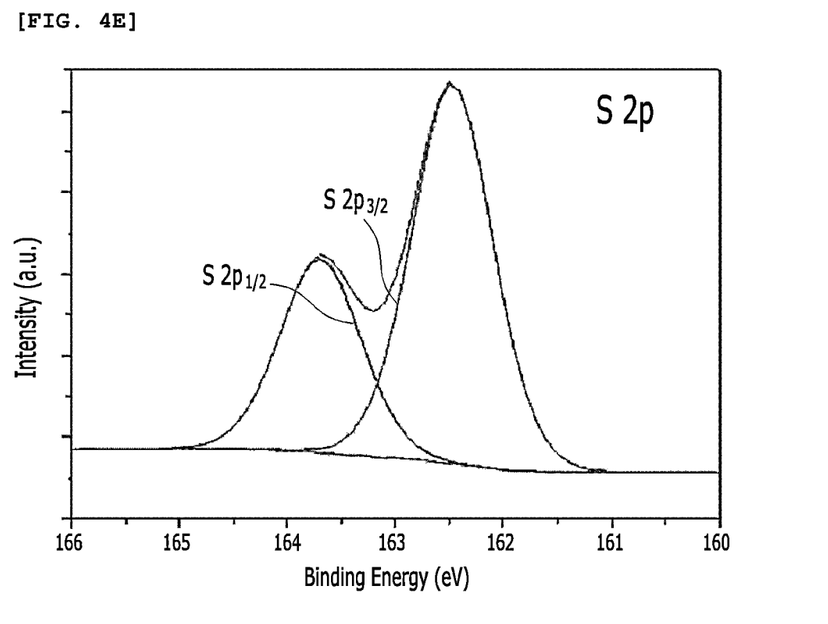

FIG. 3A to FIG. 3C are TEM images of transition metal dichalcogenide-graphene heterojunction composites according to an example and a comparative example of the present disclosure.

FIG. 3A is an in-plane high resolution transmission electron microscopy (in-plane HR TEM) plan-view image of the transition metal dichalcogenide-graphene heterojunction composite produced according to an example of the present application and a selected area electron diffraction (SAED) pattern image. Through this, it could be confirmed that the produced transition metal dichalcogenide-graphene heterojunction composite had nano-sized crystals. Further, molybdenum disulfide having a ring-shaped polycrystal and graphene indicated by dots could be confirmed in the SAED pattern image.

FIG. 3B is a high-resolution transmission electron microscopy (HR TEM) image of the transition metal dichalcogenide-graphene heterojunction composite produced according to an example of the present application. Through this, it could be confirmed that molybdenum disulfide was present in the upper portion, and graphene was present in the lower portion, and an interlayer spacing (0.65 nm to 0.67 nm) of molybdenum disulfide and an interval (0.31 nm) of graphene could be confirmed.

FIG. 3C is across-sectional image of the transition metal dichalcogenide-graphene composite produced according to a comparative example of the present application. Through this, it could be confirmed that the molybdenum disulfide-graphene composite produced by the physical transfer method had unstable boundaries by having a simple stacked structure. This suggests that, different from the molybdenum disulfide-graphene heterojunction composite according to an example of the present disclosure having uniform boundaries, performance is deteriorated, and a low yield is obtained when producing an element.

FIG. 4A to FIG. 4E are images of the transition metal dichalcogenide-graphene heterojunction composite according to an example of the present disclosure analyzed using X-ray photoelectron spectroscopy (XPS). Through these, it could be confirmed that a number of sulfur pores were generated due to a lattice structure difference between molybdenum disulfide and graphene.

Figure 5:
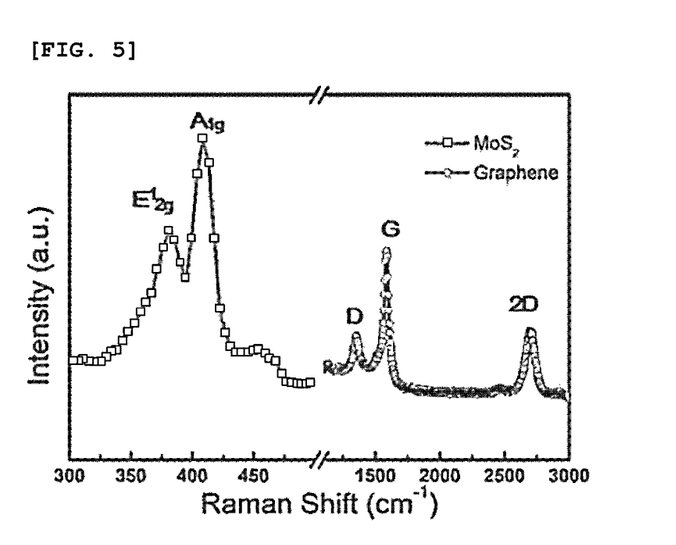
FIG. 5 is a graph of the transition metal dichalcogenide-graphene heterojunction composite according to an example of the present disclosure analyzed using Raman spectroscopy.

FIG. 5 is a graph of the transition metal dichalcogenide-graphene heterojunction composite according to an example of the present disclosure analyzed using Raman spectroscopy. Through this, it could be confirmed that the molybdenum disulfide-graphene heterojunction composite according to an example of the present application had both peaks of molybdenum disulfide and graphene.

Figure 6:
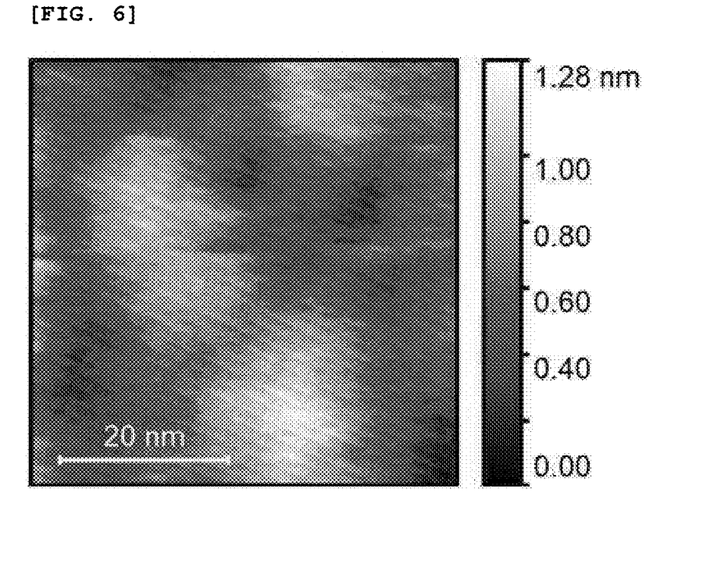
FIG. 6 is an image of the transition metal dichalcogenide-graphene heterojunction composite according to an example of the present disclosure photographed using an atomic force microscope.

FIG. 6 is an image of the transition metal dichalcogenide-graphene heterojunction composite according to an example of the present application photographed using an atomic force microscope. Through this, it could be confirmed that the produced large-area molybdenum disulfide-graphene heterojunction composite had a uniform surface.

Through FIGS. 3 to 6, it could be confirmed that the molybdenum disulfide-graphene heterojunction composite with a uniform large-area heterojunction structure was actually produced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for producing a transition metal dichalcogenide-graphene heterojunction composite, the method comprising:
    transferring a graphene onto a flexible substrate;
    depositing a transition metal layer on the flexible substrate onto which the graphene has been transferred; and
    injecting a gas containing plasma-treated sulfur (S) onto the flexible substrate on which the transition metal layer has been deposited,
    wherein the transition metal dichalcogenide-graphene heterojunction composite comprises sulfur pores.

2. The method of claim 1, wherein the transition metal layer comprises a transition metal selected from the group consisting of Mo, W, Cu, Ni, Sc, Ti, V, Cr, Mn, Fe, Co, Zn, Y, Zr, Nb, Tc, Ru, Rh, Pd, Ag, Cd, Hf, Ta, Re, Os, Ir, Pt, Au, Hg, Rf, db, Sg, Bh, Hs, Mt, Ds, Rg, Cn, and combinations thereof.

3. The method of claim 1, wherein the flexible substrate comprises a material selected from the group consisting of a silicone, a polymer, and a combination thereof.

4. The method of claim 1, wherein the graphene is synthesized by a chemical vapor deposition method.

5. The method of claim 1, wherein the depositing the transition metal layer is performed by a deposition method selected from the group consisting of electron-beam evaporation, RF/DC sputtering, ion beam sputtering, chemical vapor deposition (CVD), low pressure chemical vapor deposition (LPCVD), plasma enhanced chemical vapor deposition (PECVD), ion plating, and combinations thereof.

6. The method of claim 1, wherein the gas containing plasma-treated sulfur (S) comprises hydrogen sulfide ($H_2S$).

7. The method of claim 1, wherein the injecting the gas containing plasma-treated sulfur (S) is performed under a temperature of 100° C. to 200° C.

8. The method of claim 1, wherein the gas containing plasma-treated sulfur (S) is injected together with a carrier gas.

9. The method of claim 1, wherein the gas containing plasma-treated sulfur (S) is supplied in a flow amount of 1 sccm to 20 sccm.

10. The method of claim 1, wherein the transition metal dichalcogenide-graphene heterojunction composite comprises nanocrystals having a diameter of 5 nm to 10 nm.

11. The method of claim 10, wherein the nanocrystals have an average size adjusted to a nano scale by the plasma treatment.

12. The method of claim 1, wherein the sulfur pores are formed by a lattice structure difference between the transition metal dichalcogenide and the graphene.

13. A transition metal dichalcogenide-graphene heterojunction composite produced by the method of claim 1.

14. The transition metal dichalcogenide-graphene heterojunction composite of claim 13, comprising nanocrystals having a diameter of 5 nm to 10 nm.

15. The transition metal dichalcogenide-graphene heterojunction composite of claim 13, comprising sulfur pores.

16. A flexible element comprising the transition metal dichalcogenide-graphene heterojunction composite of claim 13.

* * * * *